United States Patent
Toyoshima et al.

(10) Patent No.: US 6,835,971 B2
(45) Date of Patent: Dec. 28, 2004

(54) SEMICONDUCTOR INTEGRATED CIRCUIT DEVICE WITH A PLURALITY OF LIMITER CIRCUITS

(75) Inventors: Hiroshi Toyoshima, Akiruno (JP); Atsuhiro Hayashi, Ome (JP); Takemi Negishi, Honjyo (JP); Takashi Uehara, Tachikawa (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/355,006

(22) Filed: Jan. 31, 2003

(65) Prior Publication Data

US 2003/0151100 A1 Aug. 14, 2003

(30) Foreign Application Priority Data

Feb. 12, 2002 (JP) ........................................ 2002-034651

(51) Int. Cl.⁷ ......................... H01L 27/10; H01L 23/52
(52) U.S. Cl. ...................... 257/207; 257/211; 257/691; 257/738; 257/759; 257/778
(58) Field of Search ................................ 257/207, 208, 257/210, 211, 758, 759, 659, 660, 690–692, 737, 738, 777, 778, 780, 786, 393; 438/118, 128, 129, 622, 623

(56) References Cited

U.S. PATENT DOCUMENTS 5,547,740 A    8/1996  Higdon et al. ............... 428/209
6,483,176 B2 * 11/2002  Noguchi et al. ............ 257/666

FOREIGN PATENT DOCUMENTS

JP    5-218042    2/1992
JP    8-250498    3/1995

* cited by examiner

Primary Examiner—Hung Vu
(74) Attorney, Agent, or Firm—Reed Smith LLP; Stanley P. Fisher, Esq.; Juan Carlos A. Marquez, Esq.

(57) ABSTRACT

A semiconductor integrated circuit device, which is intended to prevent the characteristic degradation, includes multiple limiter circuits which are laid out by being scattered across a semiconductor substrate to produce an internal power voltage of a certain voltage level. Each limiter circuit is laid out so as to have its transistor formation area located just beneath the formation area of a bump electrode which puts in an externally supplied power voltage. The scattered layout of limiter circuits avoids the concentration of current to one limiter circuit and alleviates the harmful heat-up of the limiter circuits and their periphery. The shorter wiring length from the bump electrode to the transistor results in a smaller wiring resistance, alleviating the power voltage drop on the wiring.

28 Claims, 15 Drawing Sheets

SEMICONDUCTOR INTEGRATED CIRCUIT DEVICE WITH A PLURALITY OF LIMITER CIRCUITS

BACKGROUND OF THE INVENTION

The present invention relates to a semiconductor integrated circuit device, and particularly to a semiconductor integrated circuit device of the flip chip bonding type having bump electrodes (protruding electrodes) used for on-circuit-board mounting. The invention also relates to a technique useful for the fabrication of a synchronous SRAM (static random access memory) for example.

Semiconductor integrated circuit devices of the flip chip bonding type having a formation of protruding electrodes such as solder bumps are described in Japanese Patent Unexamined Publications Nos.Hei 5(1993)-218042 and Hei 8(1996)-250498 and U.S. Pat. No. 5,547,740, for example. These patent publications show one of the basic schemes of semiconductor integrated circuit devices of the flip chip bonding type. Specifically, re-wiring lines are laid to run from bonding pads of a chip, and bump electrodes which are connected to the re-wiring lines are arrayed on the chip surface so as to be exposed over beyond the chip surface protection film. A resulting expanded spacing of bump electrodes facilitates the on-board mounting of the chip based on the connection of bump electrodes to wiring lines of a circuit board and ultimately enables the use of inexpensive circuit boards having a large line spacing.

Semiconductor integrated circuit devices have their property of withstand voltage degraded and thus have their operation voltage lowered as the trend of microstructuring of MOS transistors advances. On this account, semiconductor integrated circuit devices are often designed to produce from a higher externally supplied power voltage VDD a lower internal power voltage VDDI for the operation voltage to be supplied to their internal circuits. The lower internal power voltage VDDI is produced from the higher supplied power voltage VDD with a limiter circuit (also called voltage step-down circuit) The limiter circuit is arranged to include a driver PMOS (p-channel MOS) transistor and a differential amplifier which compares the produced power voltage VDDI with a reference voltage Vre and activates the driver PMOS transistor in response to the comparison result. The internal power voltage VDDI results from a voltage drop of the supplied power voltage VDD between the source and drain electrodes of the driver PMOS transistor. A variation of internal power voltage VDDI is evaluated in terms of a comparison result with the reference voltage Vre, and the internal power voltage VDDI is stabilized at the prescribed voltage level on a feedback control basis.

A semiconductor integrated circuit device which is designed to step down the externally supplied power voltage and feeds to the internal circuit is described in Japanese Patent Unexamined Publication No.2002-25260 for example.

SUMMARY OF THE INVENTION

There is a constant trend of higher operation frequencies among semiconductor integrated circuit devices including synchronous SRAMs (static random access memory) and synchronous DRAMs (dynamic random access memory) which operate in synchronism with the clock signal. Consequently, their internal circuits consume increased power.

In regard to this matter, the inventors of the present invention have noticed such anxieties that the limiter circuit and its periphery may be subjected to a harmful heat-up due to the concentration of a large current of internal power voltage VDDI to many internal circuit sections, resulting in a characteristic degradation of the semiconductor integrated circuit device, and that the internal power voltage VDDI may fall due to the large current and the wiring resistance between the limiter circuit and the internal circuit sections, resulting also in a characteristic degradation of the device.

It is an object of the present invention to provide a technique for preventing the characteristic degradation of semiconductor integrated circuit devices.

These and other objects and novel features of the present invention will become apparent from the following description and accompanying drawings.

Among the affairs of the present invention disclosed in this specification, representatives are briefed as follows.

In a semiconductor integrated circuit device having a semiconductor substrate, circuit elements which are formed on the substrate to make up an electrical circuit, a wiring layer which is formed on the substrate and connected electrically to the circuit elements, an organic insulation film which covers the electrical circuit, while having an opening, a conductor layer which is formed by lamination on the organic insulation film and connected electrically to the wiring layer through the opening, and a bump electrode which is connected electrically to the wiring layer by the conductor layer, there are included in the electrical circuit by being scattered across the substrate a plurality of limiter circuits for producing an internal power voltage of a prescribed voltage level, with each limiter circuit including a transistor for lowering the voltage level of an external power voltage which is put in from the outside through the bump electrode. The transistor is formed in an area so as to be arranged just underneath the formation area of the bump electrode used in for taking the power voltage.

According to the scattered layout of limiter circuits across the semiconductor substrate, the concentration of current to one limiter circuit can be avoided and the harmful heat-up of the limiter circuits and their periphery can be alleviated. Moreover, based on the layout of the transistor formation area of the limiter circuit just beneath the bump electrode formation area, the length of wiring from the power-feed bump electrode to the transistor can be reduced. The shorter wiring and thus the smaller wiring resistance contributes to the reduction of voltage drop on the wiring, and the fall of internal power voltage can be alleviated. In consequence, the characteristic degradation of the semiconductor integrated circuit device can be prevented.

The limiter circuit includes a voltage sensing circuit which senses the voltage level of the internal power voltage and a comparison circuit which compares the sensed power voltage level with the reference voltage and controls the conductivity of the transistor in response to the comparison result. The transistor is actually a plurality of p-channel MOS transistors connected in parallel, with at least part thereof being laid out so as to be located just beneath the bump electrode.

Preferably, all the limiter circuits share a single reference voltage generation circuit so that the circuit formation area is minimized.

In a semiconductor integrated circuit device having internal power feed lines for distributing the internal power voltage produced by the limiter circuits, a plurality of memory cells which are arrayed, and a plurality of word lines for selecting memory cells, there are included in the internal power feed lines inter-word-line power lines which are made from a wiring layer common to the word lines and laid between adjacent word lines and over-word-line power lines which are made from a wiring layer different from the layer of word lines, laid to intersect the inter-word-line power lines and connected electrically to them. This spread layout of internal power feed lines reduces the wiring resistance, thereby alleviating the power voltage drop.

The conductor layer can include an internal power feed line which is formed to surround the bump electrode formation area. The conductor layer can further includes an address signal line and low-voltage power feed line which distributes the low power voltage. The address signal line is preferably shielded by the low-voltage power line which is laid alongside the address signal line so that the noise induction and crosstalk are alleviated. The conductor layer can further be used for the conduction of clock signal.

DETAILED DESCRIPTION OF THE PREFERRED EMBODIMENTS

Figure 2:
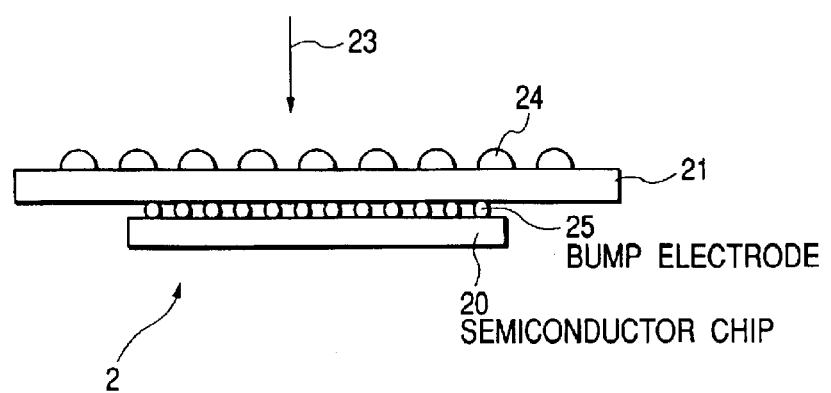
FIG. 2 is a side view of the synchronous SRAM.

FIG. 2 shows a synchronous SRAM which is an example of the semiconductor integrated circuit device based on this invention.

This synchronous SRAM indicated by numeral 2 is briefly made up of a semiconductor chip 20 and a BGA (ball grid array) substrate 21 which are joined together, although this affair is not compulsory. The semiconductor chip 20 is basically made from a semiconductor substrate such as a monocrystalline silicon substrate by the known semiconductor integrated circuit fabrication technology, although this affair is not compulsory. The BGA substrate 21 includes BGA balls 24 which are external terminals of the SRAM for the electrical connection to a circuit board or the like. The semiconductor chip 20 and BGA substrate 21 are connected electrically through bump electrodes 25.

Figure 1:
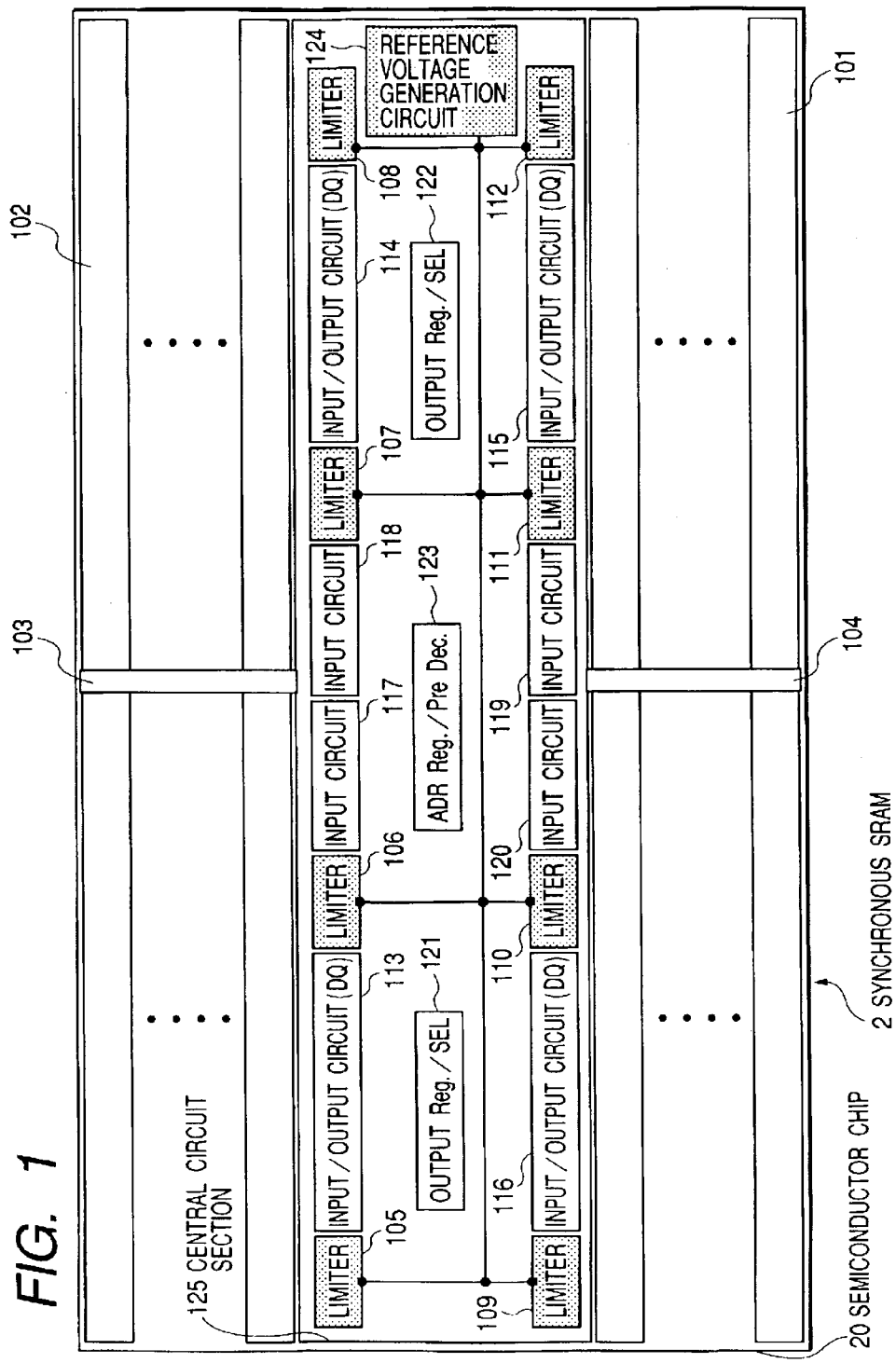
FIG. 1 is a diagram used to explain the internal layout of a synchronous SRAM as an example of the semiconductor integrated circuit device based on this invention.

FIG. 1 shows an example of the layout of the semiconductor chip 20 of the synchronous SRAM 2 seen along the arrow 23 in FIG. 2. The semiconductor chip 20 has a formation of memory cell arrays 101 and 102, which are laid out in two divided substrate zones which are separated in the lateral direction by being interposed by a central circuit section 125. The memory cell arrays 101 and 102 consist of static memory cells arranged in arrays.

In the longitudinal center sections of the memory cell arrays 101 and 102, there are laid word line drivers 103 and 104 for the respective memory cell arrays.

The central circuit section 125 includes limiter circuits 105–112 for producing an internal high power voltage VDDI, input/output circuits (DQ) 113–116 for data input and output, input circuits 117–120 for address signal input, output register-selectors (Reg./SEL) 121 and 122 for holding output data temporarily and releasing selectively to the outside, an address register-predecoder (ADR Reg./Pre Dec) 123 for holding temporarily and predecoding an address signal, and a reference voltage generation circuit 123 for producing the reference voltage, although this affair of arrangement is not compulsory.

This embodiment is intended to avoid the concentration of current to some circuit elements and wiring lines based on the scattered layout of eight limiter circuits 105–112 across the central circuit section 125, so that each of these limiter circuits 105–112 takes a fraction of the total supply current. The limiter circuits 105–112 each produce the internal high power voltage VDDI by lowering a supplied high power voltage VDD in accordance with a reference voltage Vref provided by a reference voltage generation circuit 124. For example, an internal high power voltage VDDI of 1.2 V is produced from a supplied high power voltage VDD of 2.5 V. The reference voltage generation circuit 124 is shared by all limiter circuits 105–112 so that the circuit formation area on the semiconductor chip is minimized.

Figure 5:
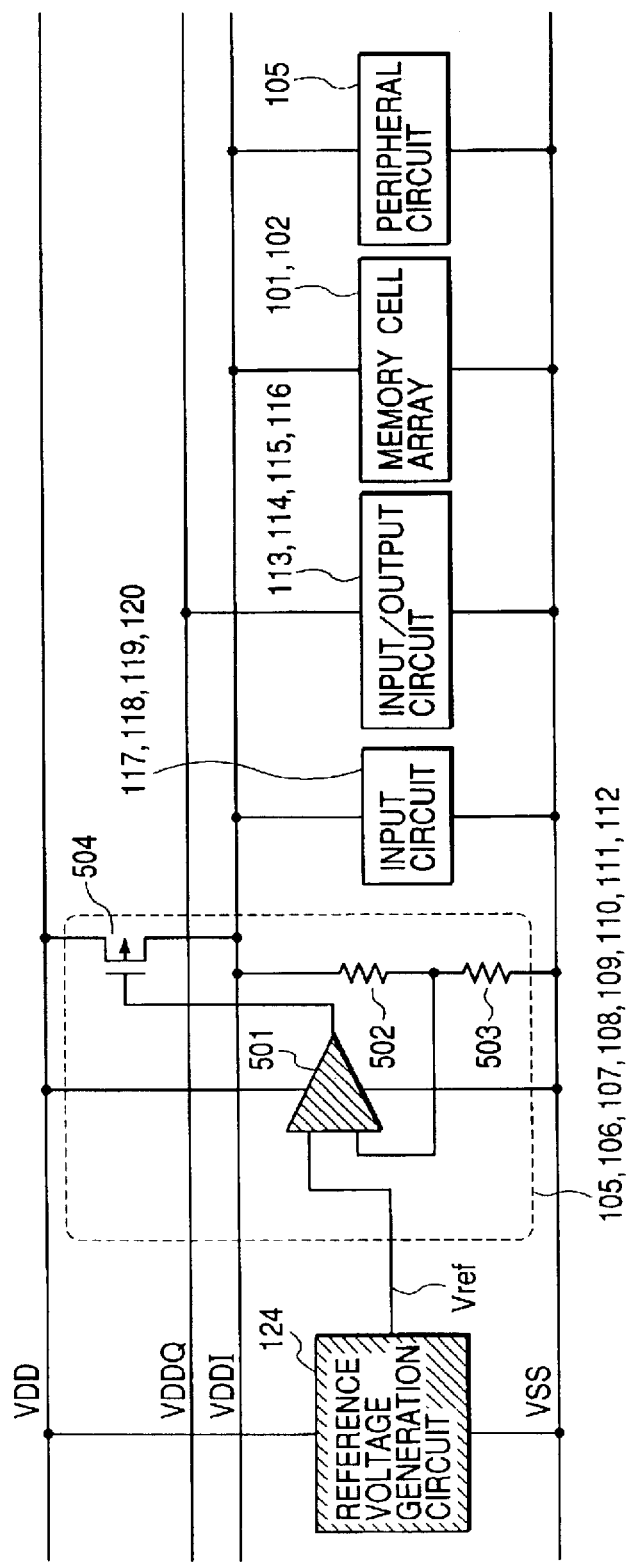
FIG. 5 is a schematic circuit diagram of the limiter circuit which is included in the synchronous SRAM.

FIG. 5 shows an example of the arrangement of the limiter circuits 105–112.

The limiter circuits 105–112, which are same in arrangement, are each made up of a differential amplifier 501, resistors 502 and 503, and a p-channel MOS transistor 504. The differential amplifier 501 operates based on the supplied high power voltage VDD. The resistors 502 and 503 are connected in series between the high power voltage VDDI line and the low power voltage VSS (GND) line to sense the voltage level of VDDI. The sensed voltage (a divided voltage which depends on the values of resistors 502 and 503) is put in to the non-inverting input terminal (+) of the differential amplifier 501, which has on the inverting terminal (−) another input of the reference voltage Vref provided by the reference voltage generation circuit 124. The differential amplifier 501 compares the sensed voltage provided by the resistors 502 and 503 with the reference voltage Vref provided by the reference voltage generation circuit 124, and controls the conductivity of the p-channel MOS transistor 504 in response to the comparison result. The p-channel MOS transistor 504 operates to step down the supplied high voltage VDD to release the internal high power voltage VDDI. If the high voltage VDDI varies due to the variation of load, the voltage variation is indicated to the differential amplifier 501 in terms of the divided voltage of the resistors 502 and 503. In case the divided voltage is lower than the reference voltage Vref, the output signal of the differential amplifier 501 operates on the p-channel MOS transistor 504 to increase the conductivity, so that the voltage VDDI rises. In case the divided voltage is higher than the reference voltage Vref, the output signal of the differential amplifier 501 operates on the p-channel MOS transistor 504 to decrease the conductivity, so that the voltage VDDI falls. Based on this feedback control, the internal high power voltage VDDI is stabilized.

The stable internal high power voltage VDDI produced by the limiter circuits 105–112 is fed to the internal circuit sections. Internal circuit sections which operate based on the power voltage VDDI include the input circuits 117–120 and memory cell arrays 101 and 102, and a peripheral circuit 505. The peripheral circuit 505 includes the output register-selectors (Reg./SEL) 121 and 122 and address register-predecoder (ADR Reg./Pre Dec) 123. The internal circuit sections are preferably supplied with the power voltage VDDI from the nearest limiter circuits 105–112 so that the fall of power voltage on the power line is minimized.

The input/output circuits 113–116 are supplied with another externally supplied high power voltage VDDQ, which is 1.5 V for example.

Figure 14:
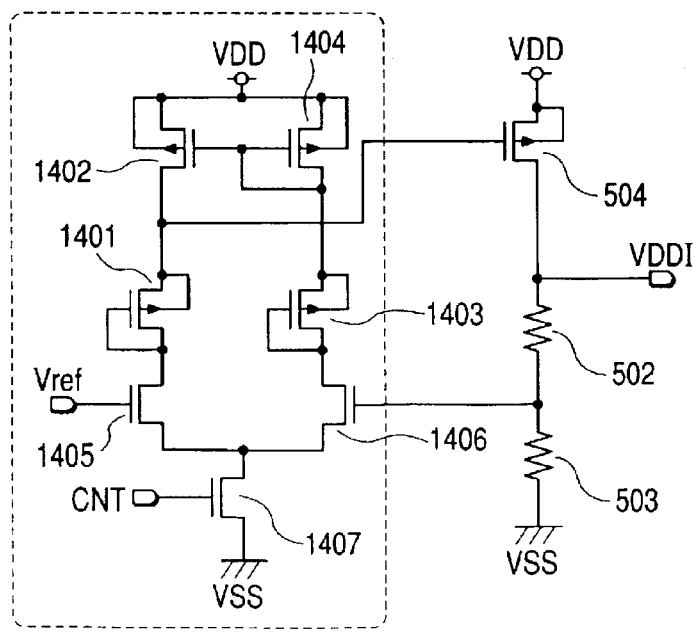
FIG. 14 is a schematic circuit diagram of the differential amplifier of the limiter circuit included in the synchronous SRAM.

FIG. 14 shows an example of the arrangement of the differential amplifier 501.

The differential amplifier 501 consists of p-channel MOS transistors 1401,1402,1403 and 1404 and n-channel MOS transistors 1405,1406 and 1407. The n-channel MOS transistors 1405 and 1406 are in differential configuration by having their source electrodes connected together to the low power voltage VSS line through the n-channel MOS transistor 1407. The n-channel MOS transistor 1407 functions as a constant current source by being supplied with a certain control voltage on its gate electrode.

The n-channel MOS transistor 1405 has its drain electrode connected to the supplied power voltage VDD through the p-channel MOS transistors 1401 and 1402. The n-channel MOS transistor 1406 has its drain electrode connected to VDD through the p-channel MOS transistors 1403 and 1404. The p-channel MOS transistor 1404 has a current mirror connection of the p-channel MOS transistor 1402, thereby forming a current mirror load for the n-channel MOS transistors 1405 and 1406 (differential pair). The n-channel MOS transistor 1405 receives on its gate electrode the reference voltage Vref provided by the reference voltage generation circuit 124. The n-channel MOS transistor 1406 receives on its gate electrode the divided voltage from the resistors 502 and 503. The differential amplifier 501 releases the output signal from the serial connection node of the p-channel MOS transistors 1401 and 1402, and it is put in to the gate electrode of the p-channel MOS transistor 504.

In the circuit arrangement shown in FIG. 14, the p-channel MOS transistors 1401 and 1403 may be eliminated.

Figure 10:
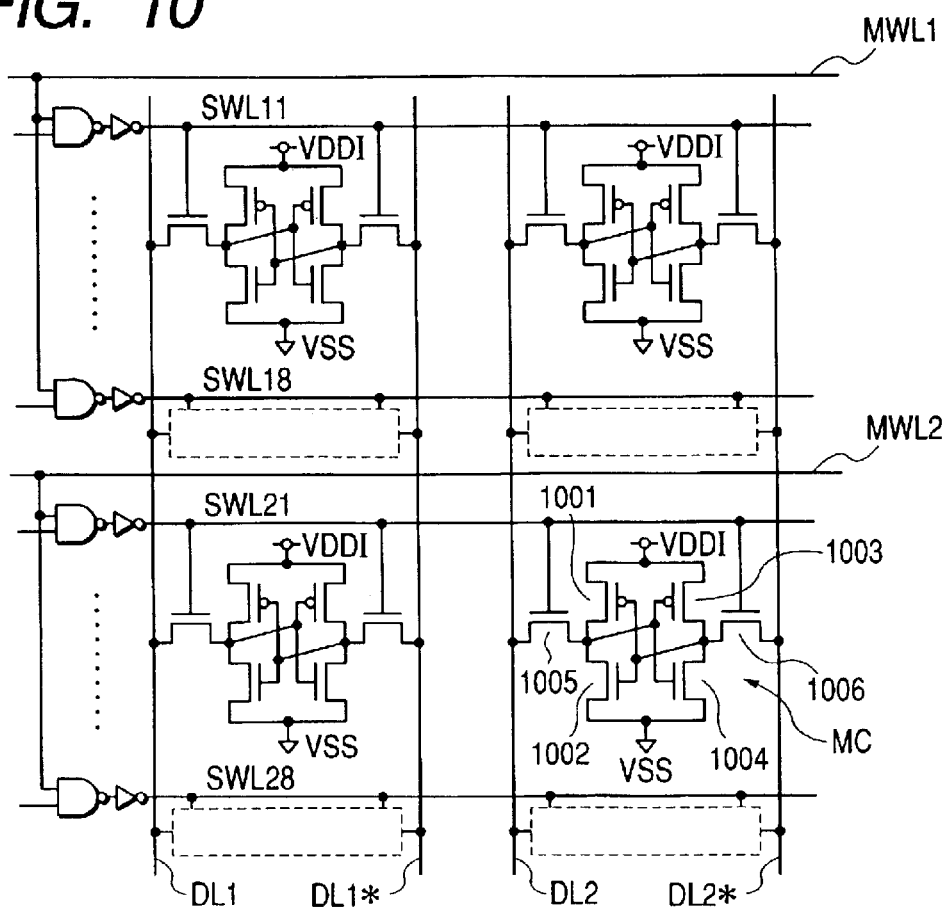
FIG. 10 is a schematic circuit diagram of the memory cell array of the synchronous SRAM.

FIG. 10 shows the principal arrangement of the memory cell arrays 101 and 102.

The memory cell arrays 101 and 102 have word lines of hierarchical structure. A main word line MWL1 is accompanied by eight subordinate (sub) word lines SWL11–SWL18. Another main word line MWL2 is accompanied by eight sub word lines SWL21–SWL28. Data line pairs DL1 and DL1* and DL2 and DL2* (symbol * denotes the inverted version) are laid to intersect the main word lines MWL1 and MWL2 and sub word lines SWL11–SWL18 and SWL21–SWL28.

At the positions where the sub word lines SWL11–SWL18 and SWL21–SWL28 and the data line pairs DL1 and DL1* and DL2 and DL2* intersect, there are disposed static memory cells MC which store bits of data. Each memory cell MC includes a storage section which is a serial loop connection of a first inverter which is formed of a p-channel MOS transistor 1001 and an n-channel MOS transistor 1002 connected in series and a second inverter which is formed of a p-channel MOS transistor 1003 and an n-channel MOS transistor 1004 connected in series, and n-channel MOS transistors 1005 and 1006 which connect the storage section to the data line pair DL1 and DL1* or DL2 and DL2*. The storage section operates by being supplied with the power voltage VDDI. One of the sub word lines SWL11–SWL18 and SWL21–SWL28 is brought to the selection level, and the corresponding n-channel MOS transistors 1005 and 1006 of memory cells become conductive to connect the storage sections to the data line pairs DL1 and DL1* and DL2 and DL2* so that bits of data are written into or read out of the memory cells.

Figure 11:
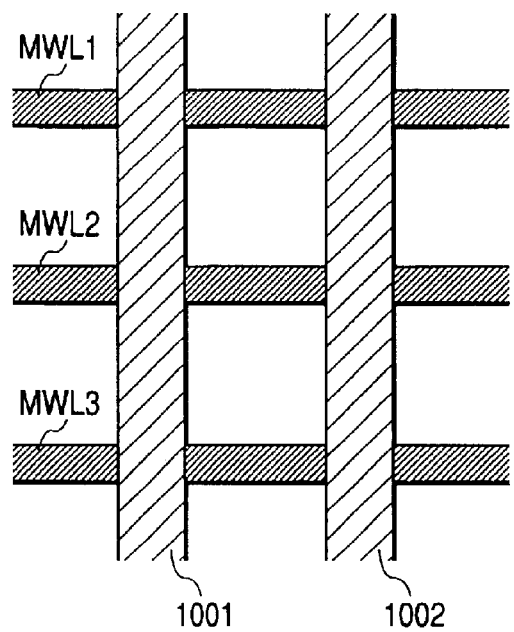
FIG. 11 is a diagram of a general memory cell array, explaining the layout relation between the main word lines and the power lines on the upper layer.
Figure 12:
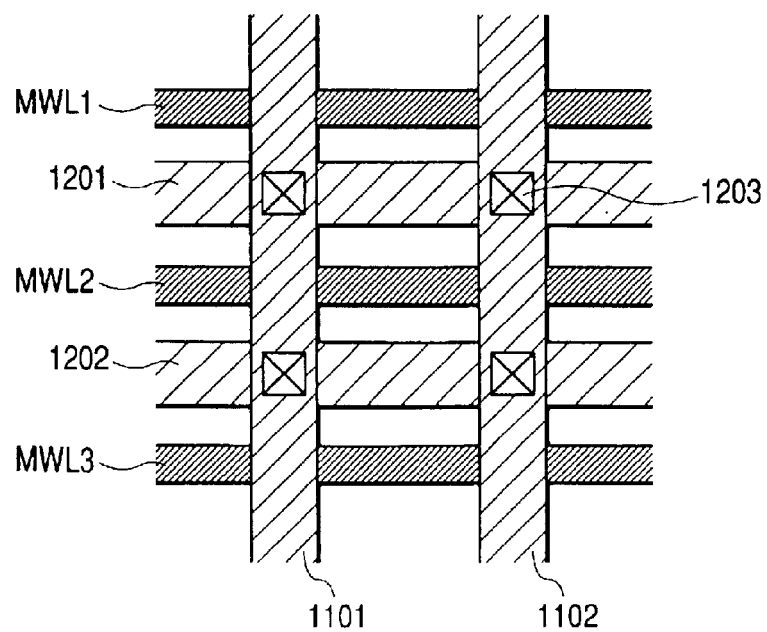
FIG. 12 is a diagram of the memory cell array of the synchronous SRAM, explaining the layout relation between the main word lines and the power lines on the upper layer.

FIG. 11 shows a case of line layout where power feed lines 1101 and 1102 of the high power voltage VDDI are laid to intersect main word lines represented by MWL1, MWL2 and MWL3. If there are marginal spaces between adjacent main word lines, it is preferable to lay supplementary power lines of VDDI. For example, as shown in FIG. 12, an inter-word-line power line 1201 is laid between the main word lines MWL1 and MWL2, and another inter-word-line power line 1202 is laid between the main word lines MWL2 and MWL3. The power lines 1101 and 1102 and the inter-word-line power lines 1201 and 1202 are connected by through-holes 1203 which are formed at the intersections of these power lines.

Figure 13:
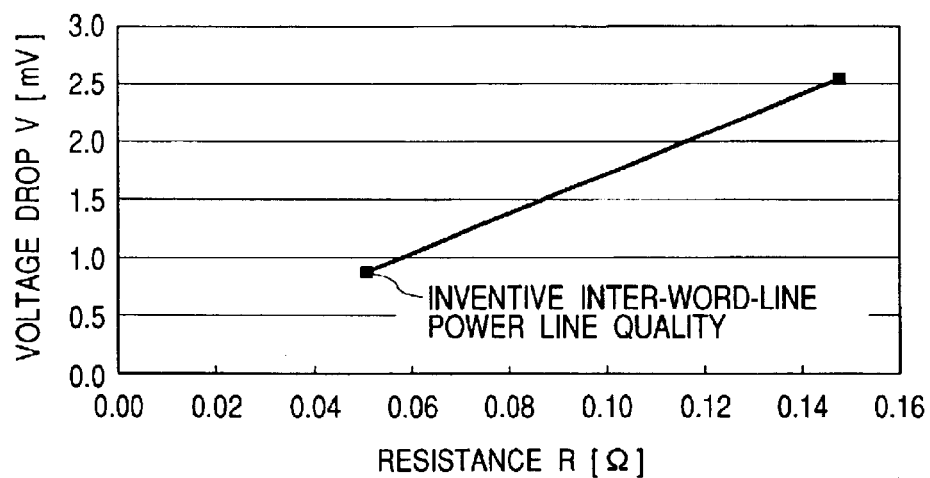
FIG. 13 is a characteristic graph used to explain the enhancement of the quality of power line of the memory cell array.

The power line supplementation by the inter-word-line power lines 1201 and 1202 effectuates the stabilization of the power voltage VDDI which is fed to the memory cell arrays 101 and 102 in a state of reduced wiring resistance as compared with the case of absence thereof shown in FIG. 11. Specifically, for example, the VDDI wiring resistance, which is 0.15 * in the absence of supplementation as shown in FIG. 11, can be reduced to 0.05 * by the supplementation of FIG. 12 as shown in FIG. 13. The smaller wiring resistance results in a smaller voltage drop on the power line.

Figure 16:
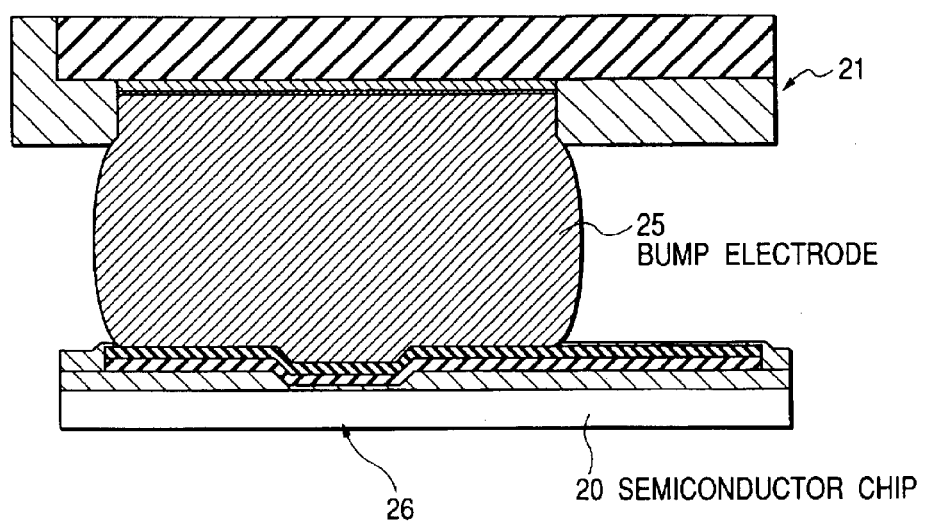
FIG. 16 is a cross-sectional diagram of the bump electrode and its periphery.
Figure 17:
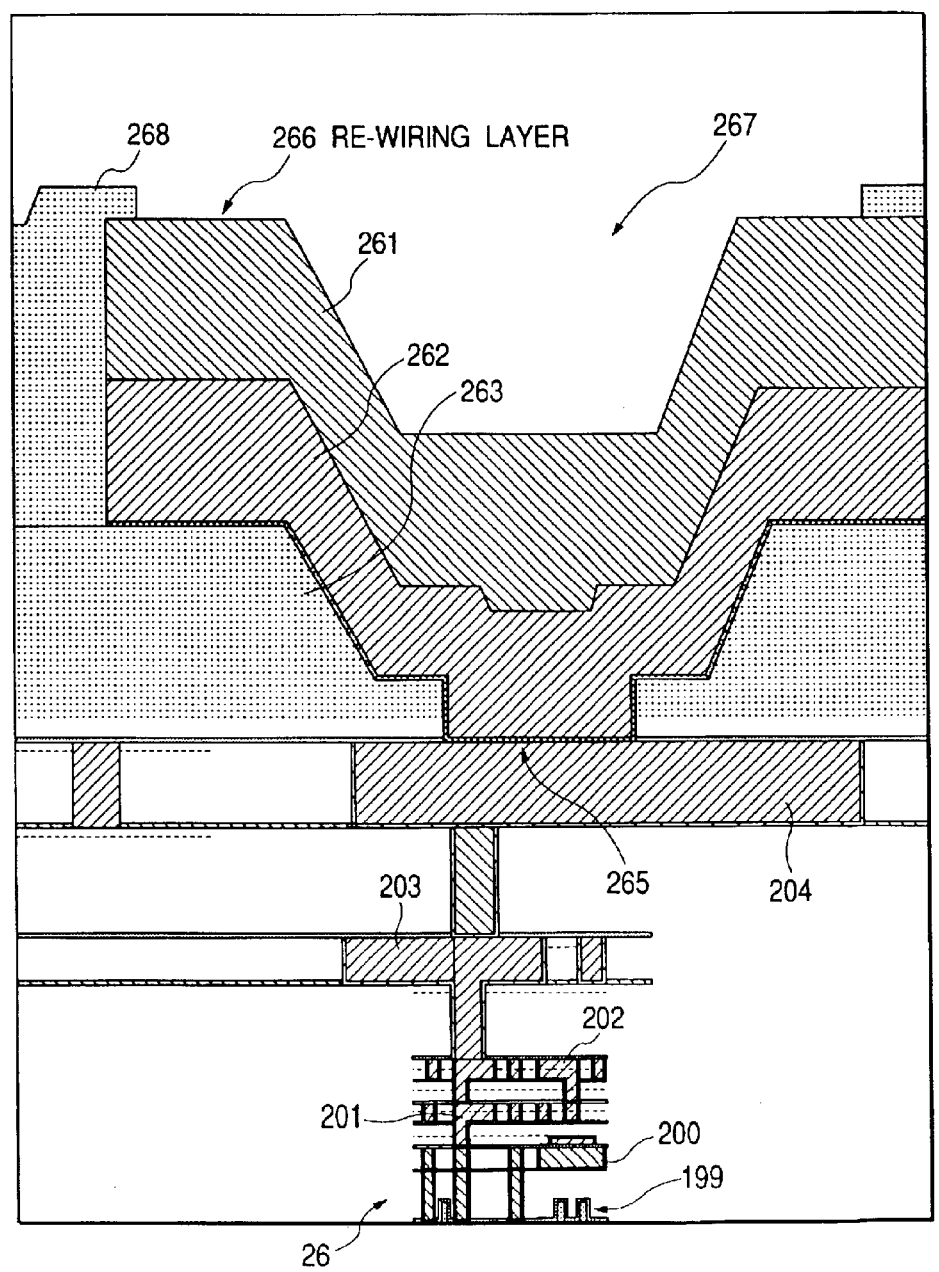
FIG. 17 is a magnified diagram of the principal portion of the cross section shown in FIG. 16.
Figure 18:
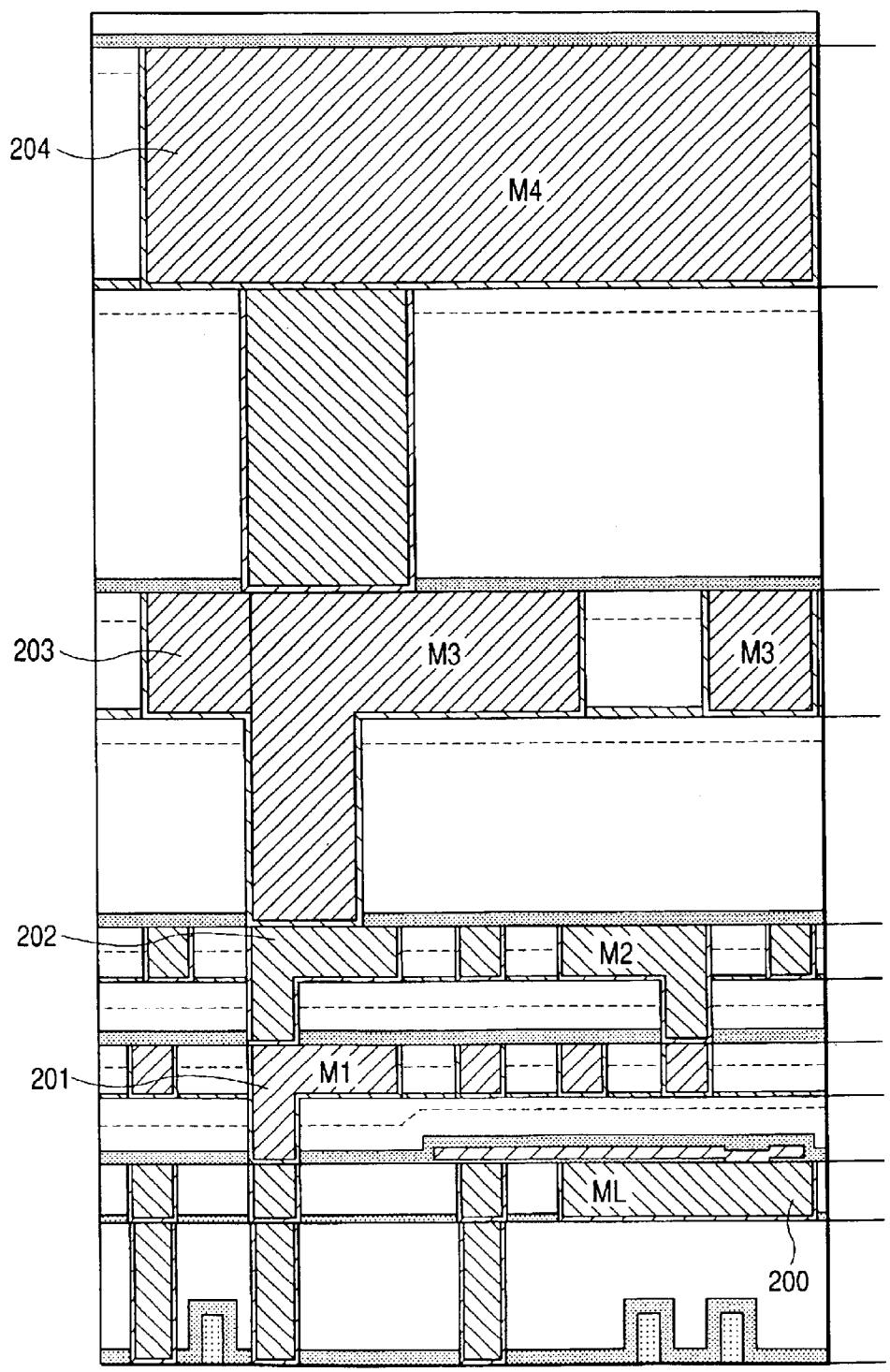
FIG. 18 is a magnified diagram of the principal portion of the cross section shown in FIG. 17.

FIG. 16 shows the cross section of the bump electrode and its periphery shown in FIG. 2. FIG. 17 is a magnified view of the principal portion 26 of FIG. 16, and FIG. 18 is a magnified view of the semiconductor chip 20 shown in FIG. 17.

The semiconductor chip 20 has on its one main surface a formation of electrical circuit made up of circuit elements and wiring lines (not shown). Specifically, there is formed a diffused layer 199 for making MOS transistors, and metallic wiring layers 200,201,202,203 and 204 are laminated on it. The metallic wiring layer 200 is the lowermost wiring line (ML) of the semiconductor chip 20, and the following metallic wiring layers 201,202,203 and 204 are the 1st wiring layer (M1), 2nd wiring layer (M2), 3rd wiring layer (M3) and 4th wiring layer or uppermost wiring layer (M4), respectively.

Insulation layers are formed between the diffused layer 199 and the metallic wiring layer 200 and among the other metallic wiring layers 201–204 so that these metallic layer are separated electrically. The diffused layer 199 and the metallic wiring layer 201 are connected electrically by a contact. The separate metallic wiring layers 201–204 can be laid to intersect each other. The electrical circuit of the semiconductor chip 20 is covered with an organic insulation film 263, with an opening 265 being formed above the uppermost wiring layer 204. The portion of the uppermost wiring layer 204 exposed by the opening is used for a through-hole or pad for the connection with other wiring layer.

The organic insulation film 263 is made of polyamide, although this affair is not compulsory. On the organic insulation film 263, there is laminated a conductive re-wiring layer (also called "wafer process package") 266, which is connected electrically to the uppermost wiring layer 204 through the opening 265. The re-wiring layer 266 is formed of different metallic layers laminated and joined electrically. The re-wiring layer 266 is used for the feeding of power to the electrical circuit and the conduction of address signal of the semiconductor chip 20 in this embodiment. Specifically, the re-wiring layer 266 has a laminated structure of a wiring layer 262 of copper (Cu) and a wiring layer 261 of nickel (Ni) so that the resistivity is small, although this affair is not compulsory. The re-wiring layer 266 is surrounded in its section over the opening 265 by an organic insulation film 268 except for an opening 267 in which it is connected electrically to a bump electrode 25.

Figure 3:
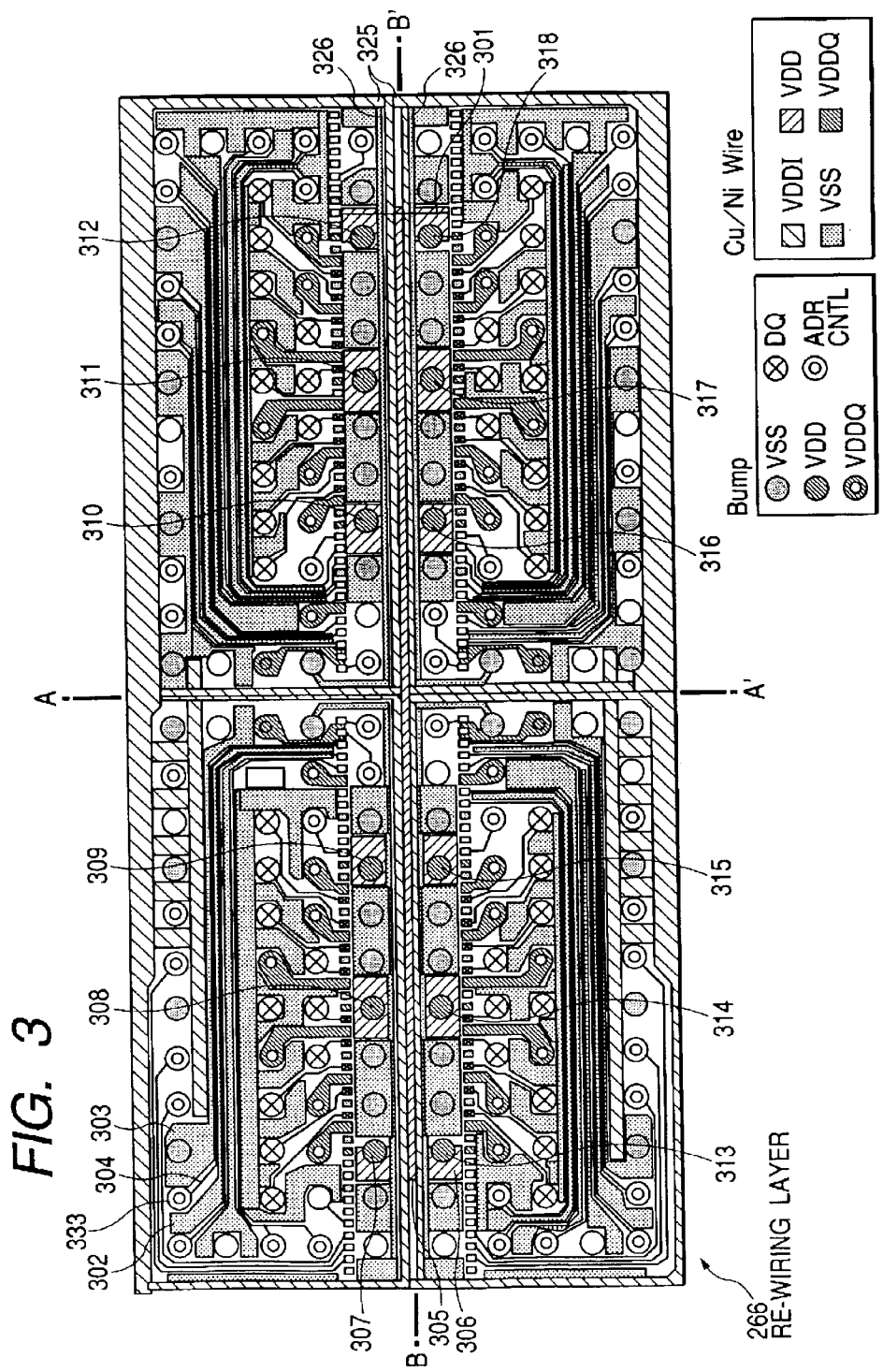
FIG. 3 is a diagram of the synchronous SRAM used to explain the layout of the re-wiring layer and the bump electrodes and pads which are connected to the layer.
Figure 4:
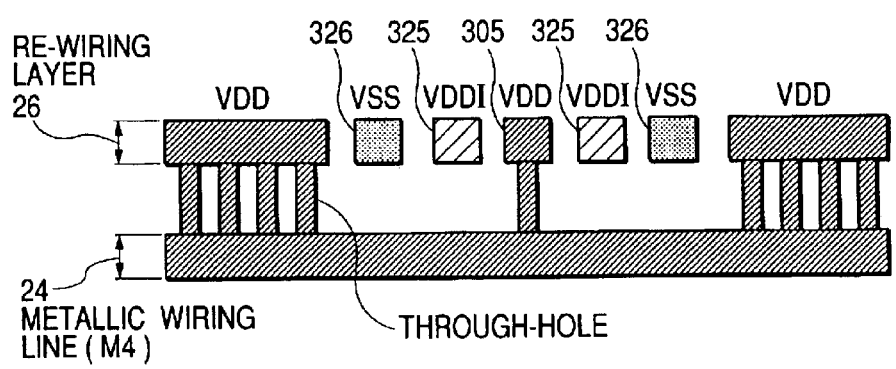
FIG. 4 is a cross-sectional diagram of the principal portion of the layout shown in FIG. 3.

FIG. 3 is a plan view of the synchronous SRAM 2, showing the layout of the re-wiring layer and bump electrodes and pads which are connected to the layer, and FIG. 4 is a cross-sectional view of the SRAM 2 taken along the line 301 of FIG. 3. Each bump electrode is shown by a small circle, and each pad is shown by a small square in FIG. 3. The bump electrodes, pads and re-wiring layer are shown by shading and hatching in different fashions thereby to distinguish different voltages and signals carried by them.

The semiconductor chip 20 has at its center along the longitudinal direction a formation of a feed line 305 of the supplied high power voltage VDD. Feed lines 325 of the internal high power voltage VDDI and feed lines 326 of the low power voltage VSS are formed alongside of and on both sides of the VDD feed line 305. VDD bump electrodes 307–312 in one alignment and VDD bump electrodes 313–318 in another alignment are laid out to confront each other alongside the VDD feed line 305, VDDI feed lines 325 and VSS feed lines 326. Among these 12 bump electrodes 307–318 for distributing the supplied high power voltage VDD, eight bump electrodes 307,309,310,312,313,315,316 and 318 are located at the positions of limiter circuits 105–112, respectively, shown in FIG. 1 for the feeding of VDD.

Figure 6:
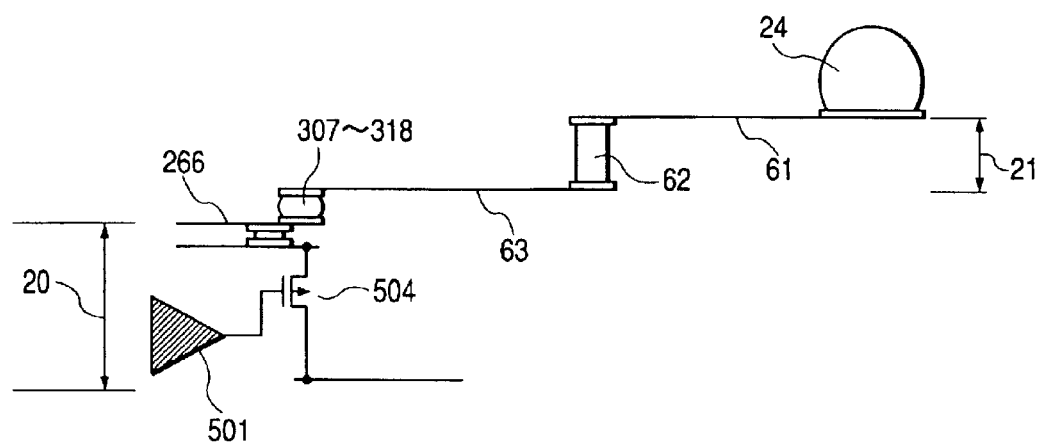
FIG. 6 is a diagram used to explain the principal wiring rote of the synchronous SRAM.

The limiter circuits 105–112 have their p-channel MOS transistors 504 formed so as to be located beneath the respective bump electrodes 307,309,310,312,313,315,316 and 318 so that their distances are small, thereby minimizing the fall of power voltage. As shown in FIG. 6 for example, the supplied power voltage VDD is put in from a BGA ball 24 formed on the BGA substrate 21 and conducted on power feed lines 61 and 63 and through a through-hole 62 buried in the BGA substrate 21 to the bump electrodes 307–318. The power voltage VDD on the bump electrodes 307–318 is conducted to the VDD feed lines of the re-wiring layer 266, and fed through the metallic wiring layers 200–204 of the semiconductor chip 20 to the source electrodes of the p-channel MOS transistors 504. Accordingly, forming the p-channel MOS transistors 504 beneath the bump electrodes 307–318 can minimize the wiring length to the source electrodes of p-channel MOS transistors 504.

The feed lines 325 of internal high power voltage VDDI are formed to surround VDD bump electrode sets 307–309, 310–312,313–315 and 316–318 which are formed in four rectangular areas which are quarters of the semiconductor chip 20 divided along the lines A–A' and B–B'. These VDD bump electrode sets are virtually determined in their positions in relation with the formation areas of p-channel MOS transistors 504, and the feed lines of internal high power voltage VDDI need to be formed by avoiding the formation areas of the VDD bump electrode sets. In order for the VDDI feed lines 325 to feed the power voltage to many internal circuit sections evenly, while avoiding the VDD bump electrode formation areas, it is advantageous for the re-wiring layer 266 to have the VDDI feed lines 325 formed to surround the VDD bump electrode sets 307–309, 310–312,313–315 and 316–318 which are formed in four rectangular areas which are quarters of the semiconductor chip 20 divided along the lines A–A' and B–B', and conduct the power voltage from the feed lines 325 to the metallic wiring layer 204 of the semiconductor chip 20.

The internal high power voltage VDDI conducted to the metallic wiring layer 204 is fed to the internal circuit by the lower metallic wiring layers 200–203.

In this embodiment, the re-wiring layer 266 is also used to conduct the address signal which is put in from the outside. For example, an address line 304 of the re-wiring layer 266 is connected to a bump electrode (shown by double circles) for the address signal or control signal input, and the address signal is conducted by the line 304 to the destination pad. From this pad, the address signal is conducted to the address register-predecoder (ADR Reg./Pre Dec) 123 through the metallic wiring layer of the semiconductor chip 20. Using the re-wiring layer 266, which is small in resistivity, for the conduction of address signal can minimize the address signal propagation delay.

In this embodiment, with the intention of preventing the noise induction to the address signal lines and the crosstalk between adjacent address signal lines, the address signal lines are laid so as to be shielded by the feed lines of low power voltage VSS. For example, the VSS feed lines 302 and 303 are laid alongside of and on both sides of the address signal line 304. The remaining address signal lines are shielded by the adjoining VSS feed lines in the same manner.

The p-channel MOS transistor 504, which needs to be large in output capacity, is actually a number of p-channel MOS transistors connected in parallel. The following explains the layout relation of the bump electrode 307 and the corresponding p-channel MOS transistor 504.

Figure 7:
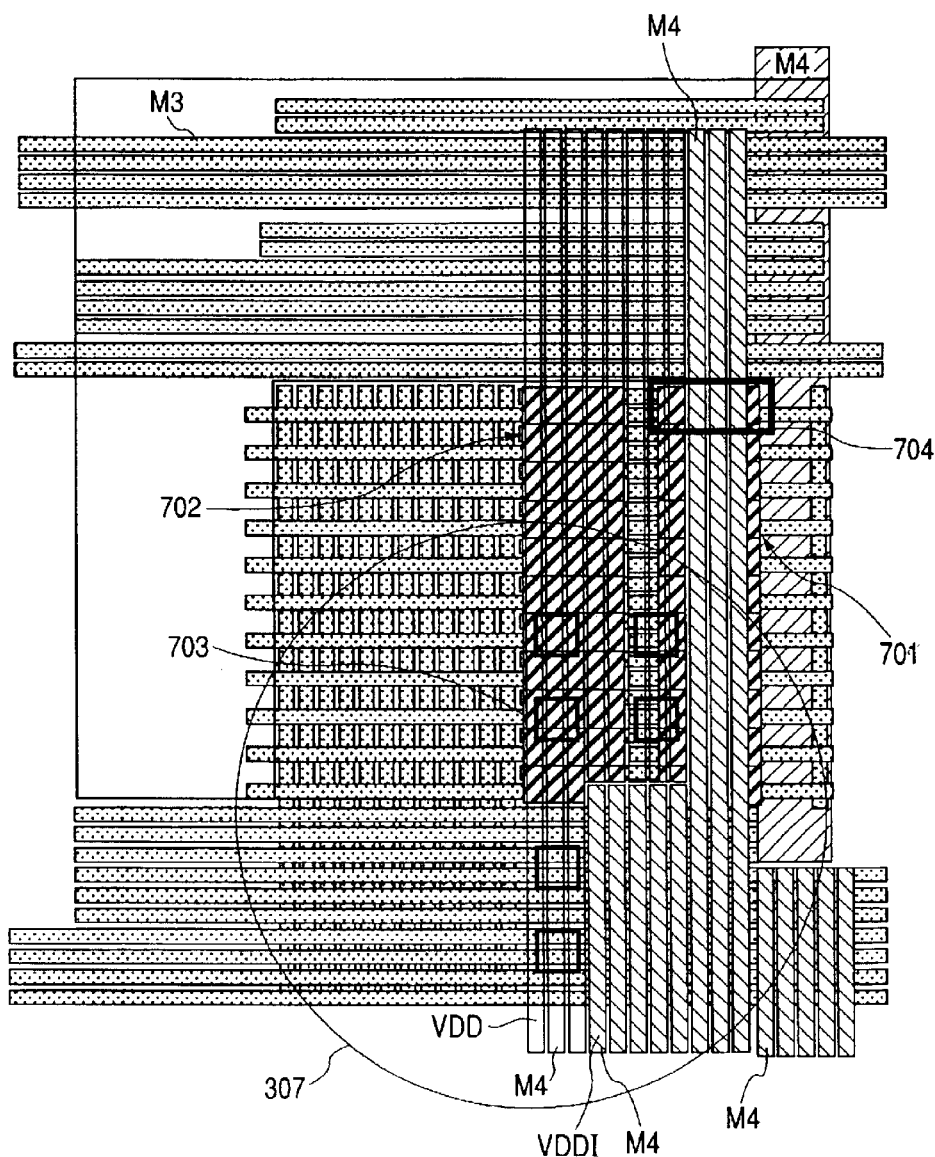
FIG. 7 is a diagram used to explain the layout of a bump electrode and its periphery included in the synchronous SRAM.

FIG. 7 shows the detailed layout of the bump electrode 307 and its periphery. The p-channel MOS transistor 504 includes a number of transistors which are connected in parallel to make a first transistor group 701 and second transistor group 702 which are spaced out by a certain distance. These first and second transistor groups 701 and 702 are laid out so that their portions are located just beneath the bump electrode 307. The first and second transistor groups 701 and 702 each have 11 unit circuits 704. Indicated by 703 is a through-hole which connects the re-wiring layer 266 to the metallic wiring layer 204.

Figure 8:
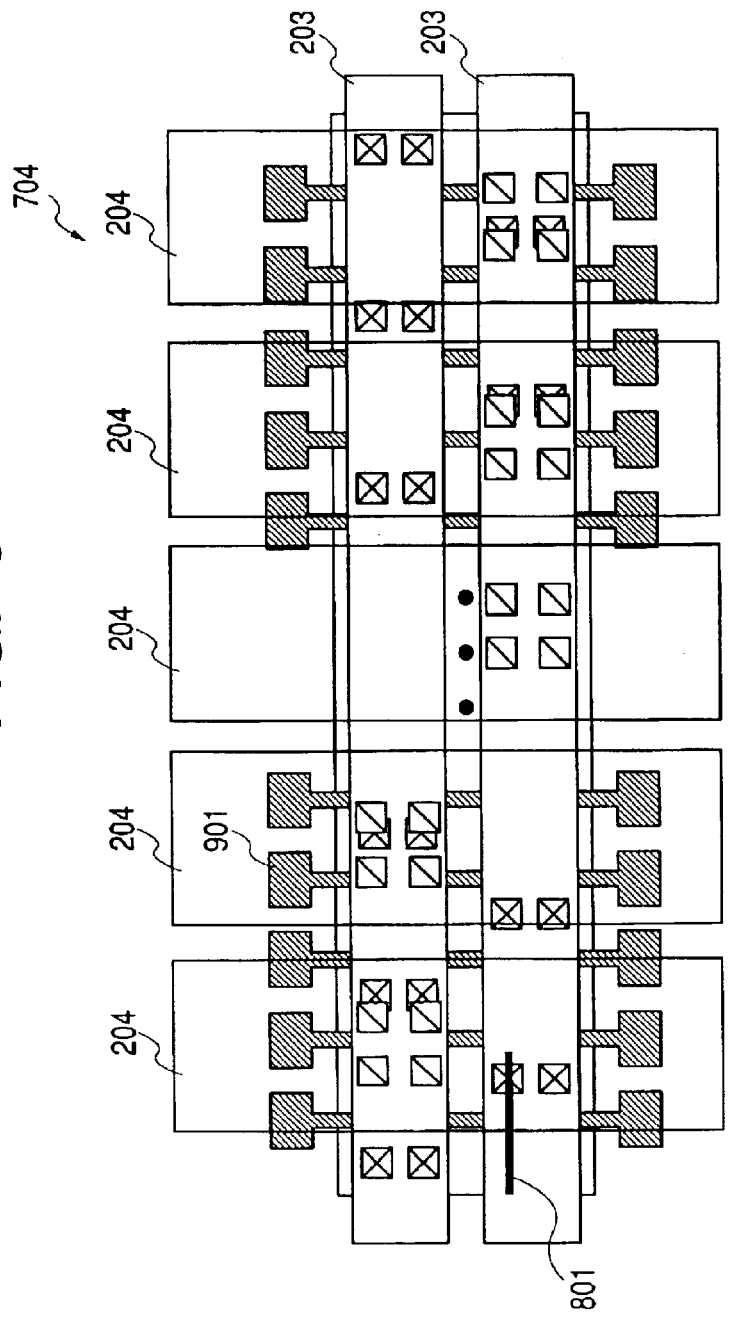
FIG. 8 is a diagram used to explain the principal arrangement of the bump electrode and its periphery shown in FIG. 7.
Figure 9:
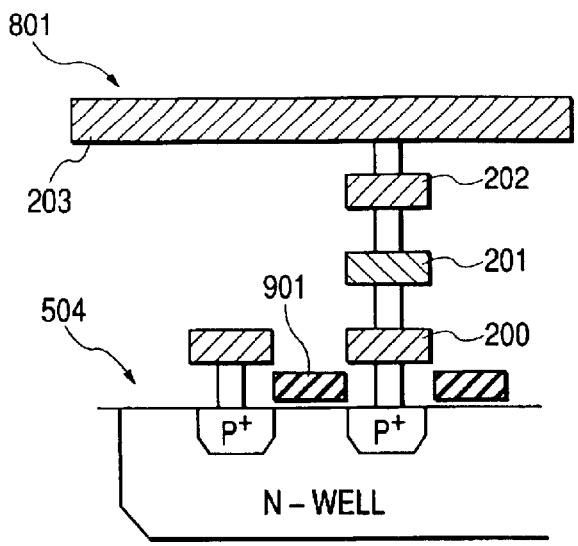
FIG. 9 is a cross-sectional diagram of the principal portion of the arrangement shown in FIG. 8.

FIG. 8 shows an example of the layout of the unit circuit 704, and FIG. 9 shows a cross-sectional view taken along the line 801 of FIG. 8. In FIG. 9, two $p^+$ regions are formed in the n-type well (N-WELL) to make a p-channel MOS transistor. Such p-channel MOS transistors of 37 in number are formed for one unit circuit 704, and they are connected in parallel by the metallic wiring layers. The two p$^+$ regions are used for a source electrode and drain electrode. The source electrode is supplied with the high power voltage VDD through the metallic wiring layers 200–204. The drain electrode is connected to the feed line of internal high power voltage VDDI through the metallic wiring layers 200–204. A gate electrode 901 is formed between the two p$^+$ regions. All the p-channel MOS transistors of the unit circuit 704 have their gate electrodes connected to the output terminals of differential amplifiers 501 of the corresponding limiter circuits 105–112. The metallic wiring layers are all connected together electrically by through-holes.

The foregoing embodiment achieves the following effectiveness.

(1) The multiple limiter circuits 105–112 are laid out by being scattered across the semiconductor substrate so as to avoid the concentration of current to one limiter circuit, and the resulting alleviated heat-up of the limiter circuits and their periphery prevents the characteristic degradation of the SRAM.

(2) The single reference voltage generation circuit 124 is shared by the limiter circuits 105–112, instead of being provided individually for the circuits, and the circuit formation area on the semiconductor chip can be minimized.

(3) In the case with the addition of the inter-word-line power lines 1201 and 1202 for the supplementation of power feed line, the internal high power voltage VDDI which is fed to the memory cell arrays 101 and 102 can be stabilized. In consequence, the characteristic degradation of the synchronous SRAM 2 attributable to a fall of VDDI voltage on the power feed line can be prevented.

(4) The feed lines 302 and 303 of low power voltage VSS are laid alongside of and on both sides of the address signal line 304 so that it is shielded by the VSS feed lines. The shielding of the address signal line 304 prevents it from being subjected to the noise induction and crosstalk from the adjacent address signal lines, and the operational error of the synchronous SRAM 2 can be prevented.

Although the present invention has been described in connection with the specific embodiment, the invention is not confined to this embodiment, but various alterations are obviously possible without departing from the essence of the invention.

Figure 15:
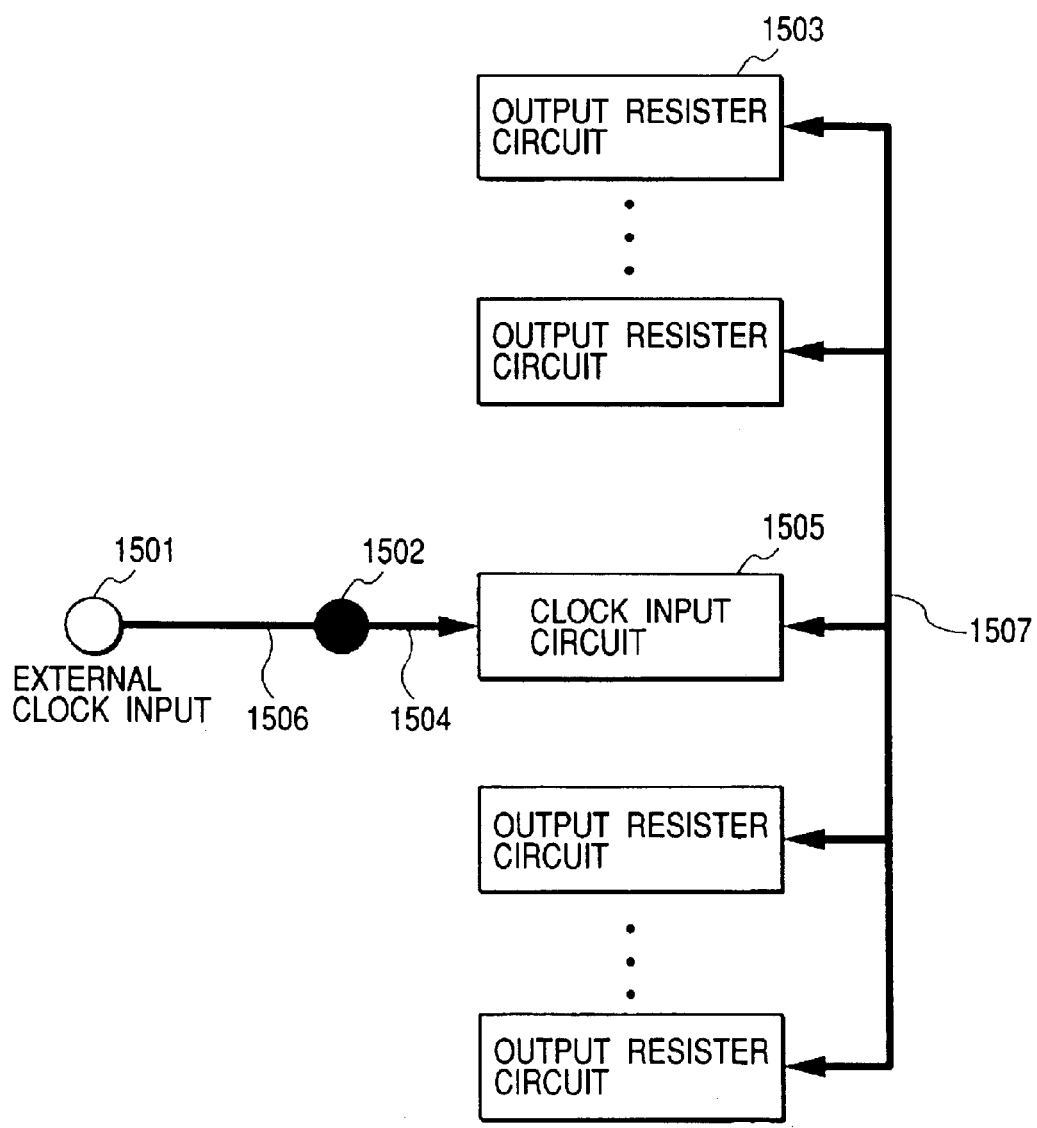
FIG. 15 is a diagram used to explain the clock signal distribution system of the synchronous SRAM.

For example, the re-wiring layer 266 (refer to FIG. 17) can further be used for the distribution of clock signal as shown in FIG. 15.

A clock signal put in from the outside through a BGA ball 1501 is conducted by a conductor layer 1506 buried in the BGA substrate to a bump electrode 1502, from which the signal is conducted by a clock signal line 1504 of the re-wiring layer 266 and delivered to a clock buffer circuit 1505 in the semiconductor chip 20. The clock signal released by the clock buffer circuit 1505 is conducted by another clock signal line 1507 of the re-wiring layer 266 and delivered to internal circuit sections such as output registers 1503. The clock signal lines 1504 and 1507 are small in resistivity due to the use of the re-wiring layer 266. Accordingly, even relatively long clock signal lines 1504 and 1507 can have a smaller clock signal propagation delay, allowing a higher clock signal frequency.

Although the present invention has been described for the synchronous SRAM which is a specific application, the invention is not confined to this embodiment, but can be applied extensively to various kinds of semiconductor integrated circuit devices.

The present invention is applicable generally to electrical circuits made up of circuit elements and wiring layers formed on semiconductor substrates.

Among the affairs of the present invention disclosed in this specification, the major effectiveness is briefed as follows.

Multiple limiter circuits are laid out by being scattered across a semiconductor substrate so as to avoid the concentration of current to one limiter circuit, and the resulting alleviated heat-up of the limiter circuits and their periphery prevents the characteristic degradation of the semiconductor integrated circuit device. Each limiter circuit has its transistor formed in an area so as to be located just beneath the associated bump electrode so that the wiring length of power voltage is short, and a resulting smaller wiring resistance and thus a smaller voltage fall of the power voltage on the power line prevents the characteristic degradation of the semiconductor integrated circuit device.

What is claimed is:

1. A semiconductor integrated circuit device comprising:
    a semiconductor substrate;
    circuit elements which are formed on said semiconductor substrate to constitute an electrical circuit;
    a wiring layer which is formed on said semiconductor substrate and connected electrically to said circuit elements;
    an organic insulation film which is formed to cover said electrical circuit, while having an opening;
    a conductor layer which is formed by lamination on said organic insulation film and connected electrically to said wiring layer through said opening; and
    a bump electrode which is connected to said wiring layer by said conductor layer,
    wherein said electrical circuit includes a plurality of limiter circuits which are laid out by being scattered across said semiconductor substrate to produce an internal power voltage of a prescribed voltage,
    wherein each of said limiter circuits includes a transistor which operates to lower the voltage level of a power voltage which is put in from the outside through said bump electrode, and
    wherein at least part of said transistor is formed so as to be located just beneath the formation area of said bump electrode which is used in taking the power voltage.

2. The semiconductor integrated circuit device according to claim 1, wherein said limiter circuits each include:
    a voltage sensing circuit which senses the voltage level of said internal power voltage; and
    a comparison circuit which compares the sensed voltage provided by said voltage sensing circuit with a predetermined reference voltage and controls the conductivity of said transistor in response to the comparison result.

3. The semiconductor integrated circuit device according to claim 2, wherein said transistor is formed of a plurality of p-channel MOS transistors connected in parallel to form a transistor group, with at least part of said MOS transistors being formed so as to be located just beneath the formation area of said bump electrode.

4. The semiconductor integrated circuit device according to claim 3, including:
    power feed paths which supply the internal power voltage produced by said limiter circuits to the internal circuit;

a plurality of memory cells which are arrayed; and a plurality of word lines for selecting a set of memory cells among said memory cells, wherein said power feed paths includes a plurality of inter-word-line power lines which are made from a wiring layer common to said word lines and laid between adjacent word lines, and wherein a plurality of over-word-line power lines which are made from a wiring layer different from that of said inter-word-line power lines, laid to intersect said inter-word-line power lines, and connected electrically to said inter-word-line power lines.

5. The semiconductor integrated circuit device according to claim 3, wherein said conductor layer includes an internal power feed line which is laid to surround the formation area of said bump electrode.

6. The semiconductor integrated circuit device according to claim 3, wherein said conductor layer includes a wiring line for conducting an address signal and wiring line for feeding the low power voltage to the internal circuit, and wherein said address signal line is laid so as to be shielded by said low power voltage feed line which is laid alongside said address signal line.

7. The semiconductor integrated circuit device according to claim 3, wherein said conductor layer includes:

an internal power voltage feed line which is laid to surround the formation area of said bump electrode;

a wiring line for conducting an address signal; and a wiring line for feeding the low power voltage to the internal circuit, said address signal line being laid so as to be shielded by said low power voltage feed line which is laid alongside said address signal line.

8. The semiconductor integrated circuit device according to claim 3, wherein said conductor layer includes a wiring line for conducting a clock signal to said electrical circuit.

9. The semiconductor integrated circuit device according to claim 3, wherein said conductor layer includes:

a wiring line for conducting a clock signal to said electrical circuit;

an internal power voltage feed line which is laid in ring shape to surround the formation area of said bump electrode; and a wiring line for conducting an address signal; and a wiring line for feeding a low power voltage to the internal circuit, said address signal line being laid so as to be shielded by said low power voltage feed line which is laid out alongside said address signal line.

10. The semiconductor integrated circuit device according to claim 2, further including a reference voltage generation circuit which produces the reference voltage, said reference voltage generation circuit being shared among said limiter circuits.

11. The semiconductor integrated circuit device according to claim 10, including:

power feed paths which supply the internal power voltage produced by said limiter circuits to the internal circuit;

a plurality of memory cells which are arrayed; and a plurality of word lines for selecting a set of memory cells among said memory cells, wherein said power feed paths includes a plurality of inter-word-line power lines which are made from a wiring layer common to said word lines and laid between adjacent word lines, and wherein a plurality of over-word-line power lines which are made from a wiring layer different from that of said inter-word-line power lines, laid to intersect said inter-word-line power lines, and connected electrically to said inter-word-line power lines.

12. The semiconductor integrated circuit device according to claim 10, wherein said conductor layer includes an internal power feed line which is laid to surround the formation area of said bump electrode.

13. The semiconductor integrated circuit device according to claim 10, wherein said conductor layer includes a wiring line for conducting an address signal and wiring line for feeding the low power voltage to the internal circuit, and wherein said address signal line is laid so as to be shielded by said low power voltage feed line which is laid alongside said address signal line.

14. The semiconductor integrated circuit device according to claim 10, wherein said conductor layer includes:

an internal power voltage feed line which is laid to surround the formation area of said bump electrode;

a wiring line for conducting an address signal; and a wiring line for feeding the low power voltage to the internal circuit, said address signal line being laid so as to be shielded by said low power voltage feed line which is laid alongside said address signal line.

15. The semiconductor integrated circuit device according to claim 10, wherein said conductor layer includes a wiring line for conducting a clock signal to said electrical circuit.

16. The semiconductor integrated circuit device according to claim 10, wherein said conductor layer includes:

a wiring line for conducting a clock signal to said electrical circuit;

an internal power voltage feed line which is laid in ring shape to surround the formation area of said bump electrode; and a wiring line for conducting an address signal; and a wiring line for feeding a low power voltage to the internal circuit, said address signal line being laid so as to be shielded by said low power voltage feed line which is laid out alongside said address signal line.

17. The semiconductor integrated circuit device according to claim 2, including:

power feed paths which supply the internal power voltage produced by said limiter circuits to the internal circuit;

a plurality of memory cells which are arrayed; and a plurality of word lines for selecting a set of memory cells among said memory cells, wherein said power feed paths includes a plurality of inter-word-line power lines which are made from a wiring layer common to said word lines and laid between adjacent word lines, and wherein a plurality of over-word-line power lines which are made from a wiring layer different from that of said inter-word-line power lines, laid to intersect said inter-word-line power lines, and connected electrically to said inter-word-line power lines.

18. The semiconductor integrated circuit device according to claim 2, wherein said conductor layer includes an internal power feed line which is laid to surround the formation area of said bump electrode.

19. The semiconductor integrated circuit device according to claim 2,
wherein said conductor layer includes a wiring line for conducting an address signal and wiring line for feeding the low power voltage to the internal circuit, and
wherein said address signal line is laid so as to be shielded by said low power voltage feed line which is laid alongside said address signal line.

20. The semiconductor integrated circuit device according to claim 2, wherein said conductor layer includes:
an internal power voltage feed line which is laid to surround the formation area of said bump electrode;
a wiring line for conducting an address signal; and
a wiring line for feeding the low power voltage to the internal circuit,
said address signal line being laid so as to be shielded by said low power voltage feed line which is laid alongside said address signal line.

21. The semiconductor integrated circuit device according to claim 2, wherein said conductor layer includes a wiring line for conducting a clock signal to said electrical circuit.

22. The semiconductor integrated circuit device according to claim 2, wherein said conductor layer includes:
a wiring line for conducting a clock signal to said electrical circuit;
an internal power voltage feed line which is laid in ring shape to surround the formation area of said bump electrode; and
a wiring line for conducting an address signal; and
a wiring line for feeding a low power voltage to the internal circuit,
said address signal line being laid so as to be shielded by said low power voltage feed line which is laid out alongside said address signal line.

23. The semiconductor integrated circuit device according to claim 1, including:
power feed paths which supply the internal power voltage produced by said limiter circuits to the internal circuit;
a plurality of memory cells which are arrayed; and
a plurality of word lines for selecting a set of memory cells among said memory cells,
wherein said power feed paths includes a plurality of inter-word-line power lines which are made from a wiring layer common to said word lines and laid between adjacent word lines, and
wherein a plurality of over-word-line power lines which are made from a wiring layer different from that of said inter-word-line power lines, laid to intersect said inter-word-line power lines, and connected electrically to said inter-word-line power lines.

24. The semiconductor integrated circuit device according to claim 1, wherein said conductor layer includes an internal power feed line which is laid to surround the formation area of said bump electrode.

25. The semiconductor integrated circuit device according to claim 1,
wherein said conductor layer includes a wiring line for conducting an address signal and wiring line for feeding the low power voltage to the internal circuit, and
wherein said address signal line is laid so as to be shielded by said low power voltage feed line which is laid alongside said address signal line.

26. The semiconductor integrated circuit device according to claim 1, wherein said conductor layer includes:
an internal power voltage feed line which is laid to surround the formation area of said bump electrode;
a wiring line for conducting an address signal; and
a wiring line for feeding the low power voltage to the internal circuit,
said address signal line being laid so as to be shielded by said low power voltage feed line which is laid alongside said address signal line.

27. The semiconductor integrated circuit device according to claim 1, wherein said conductor layer includes a wiring line for conducting a clock signal to said electrical circuit.

28. The semiconductor integrated circuit device according to claim 1, wherein said conductor layer includes:
a wiring line for conducting a clock signal to said electrical circuit;
an internal power voltage feed line which is laid in ring shape to surround the formation area of said bump electrode; and
a wiring line for conducting an address signal; and
a wiring line for feeding a low power voltage to the internal circuit,
said address signal line being laid so as to be shielded by said low power voltage feed line which is laid out alongside said address signal line.

* * * * *